United States Patent
Amiya et al.

(10) Patent No.: US 8,820,335 B2
(45) Date of Patent: Sep. 2, 2014

(54) CLEANING APPARATUS, SUBSTRATE PROCESSING SYSTEM, CLEANING METHOD, PROGRAM AND STORAGE MEDIUM

(75) Inventors: Michitaka Amiya, Koshi (JP); Kazuyoshi Eshima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 614 days.

(21) Appl. No.: 12/778,209

(22) Filed: May 12, 2010

(65) Prior Publication Data

US 2010/0288313 A1 Nov. 18, 2010

(30) Foreign Application Priority Data

May 12, 2009 (JP) .................. 2009-115490

(51) Int. Cl.
*B08B 3/02* (2006.01)
*H01L 21/67* (2006.01)
*H01L 21/673* (2006.01)

(52) U.S. Cl.
CPC .... *H01L 21/67313* (2013.01); *H01L 21/67051* (2013.01)
USPC ........................................ 134/198

(58) Field of Classification Search
CPC ................. H01L 21/67313; H01L 21/67051; B08B 3/02; Y10S 134/902
USPC .................................... 134/182, 183, 198, 200
See application file for complete search history.

(56) References Cited

U.S. PATENT DOCUMENTS 6,245,156 B1 * 6/2001 Taniyama et al. ............... 134/6

FOREIGN PATENT DOCUMENTS

JP    2005-101524 A    4/2005

* cited by examiner

*Primary Examiner* — Michael Kornakov
*Assistant Examiner* — Douglas Lee
(74) *Attorney, Agent, or Firm* — Abelman, Frayne & Schwab

(57) ABSTRACT

Disclosed is a cleaning apparatus capable of cleaning a holding unit of a holding member that holds a substrate. The cleaning apparatus is configured to prevent a cleaning liquid from adhering to a rear-end unit of the holding member where a drying is difficult to be done, while a cleaning process is performed by spraying the cleaning liquid to the holding unit. Also disclosed are a substrate processing system that incorporates the cleaning apparatus, a cleaning method based on the cleaning apparatus, a program to perform the cleaning method, and a storage medium to store the program. The cleaning apparatus is equipped with a cleaning unit that cleans the holding unit by spraying the cleaning liquid to the holding unit, and a cover unit that covers the rear-end unit by making a back-and-forth operation with respect to the holding member.

7 Claims, 7 Drawing Sheets

CLEANING APPARATUS, SUBSTRATE PROCESSING SYSTEM, CLEANING METHOD, PROGRAM AND STORAGE MEDIUM

This application is based on and claims priority from Japanese Patent Application No. 2009-115490, filed on May 12, 2009, with the Japanese Patent Office, the disclosure of which is incorporated herein in its entirety by reference.

TECHNICAL FIELD

The present disclosure relates to a cleaning apparatus that cleans a holding member including a holding unit having a plurality of holding grooves to hold a substrate, and a rear-end unit extended from the holding unit with no holding grooves thereon. The present disclosure also relates to a substrate processing system equipped with the cleaning apparatus, a cleaning method based on the cleaning apparatus, a program to perform the cleaning method and a storage medium to store the program. Particularly, the cleaning apparatus of the present disclosure is configured to prevent a cleaning liquid from adhering to the rear-end unit of the holding member where a drying is difficult to be done, while a cleaning process is performed by spraying a cleaning liquid to the holding unit.

BACKGROUND

Conventionally, various types of cleaning apparatuses and cleaning methods have been known that clean a chuck such as the holding member where a plurality of substrates such as semiconductor wafers are held and transferred. See, for example, Japanese Patent Application Laid-Open No. 2005-101524.

The cleaning apparatus as disclosed in Japanese Patent Application Laid-Open No. 2005-101524 is equipped with a two-fluid supply nozzle that sprays a gas such as N2 gas along with a cleaning liquid such as a deionized water toward the holding grooves of the holding member such as a chuck, and a cleaning liquid supply nozzle that sprays the cleaning liquid toward a side surface of the holding member. An air cylinder is installed in the cleaning apparatus that moves the two-fluid supply nozzle and cleaning liquid supply nozzle along with the longitudinal direction of the holding member. In particular, in the cleaning apparatus of Japanese Patent Application Laid-Open No. 2005-101524, the two-fluid supply nozzle sprays deionized water and N2 gas toward the holding grooves earlier than the cleaning liquid supply nozzle sprays the cleaning liquid, by the operation of the air cylinder. Moreover, the cleaning apparatus of Japanese Patent Application Laid Open No. 2005-101524 is equipped with a gas supply nozzle that sprays the gas toward the holding member. The gas supply nozzle is also configured to be moved along the longitudinal direction of the holding member. Also, after a cleaning process is performed for the holding member by spraying the cleaning liquid from the two-fluid supply nozzle or from the cleaning liquid supply nozzle, a dry out process for the holding member is performed by spraying the gas from the gas supply nozzle toward the holding member.

However, in the conventional cleaning apparatus as illustrated in Japanese Patent Application Laid Open No. 2005-101524, droplets of the cleaning liquid may be adhered to the rear-end unit (a source portion) of the holding member, when the two fluid supply nozzle or the cleaning liquid supply nozzle sprays the cleaning liquid to the holding member. The attached droplets of the cleaning liquid at the rear-end unit of the holding member may not be eliminated completely by a gas spray from the gas supply nozzle. As a result, because of the remaining droplets of the cleaning liquid, the rear-end unit of the holding member may not be dried out sufficiently.

SUMMARY

According to an embodiment, there is provided a cleaning apparatus configured to clean a holding member having a holding unit where a plurality of holding grooves are formed to hold a substrate, and a rear-end unit extended from the holding unit without the holding grooves thereon. The cleaning apparatus is equipped with a cleaning unit that cleans the holding unit of the holding member by spraying a cleaning liquid toward the holding unit, and a cover unit that covers the rear-end unit of the holding member by performing a back-and-forth operation with respect to the holding member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
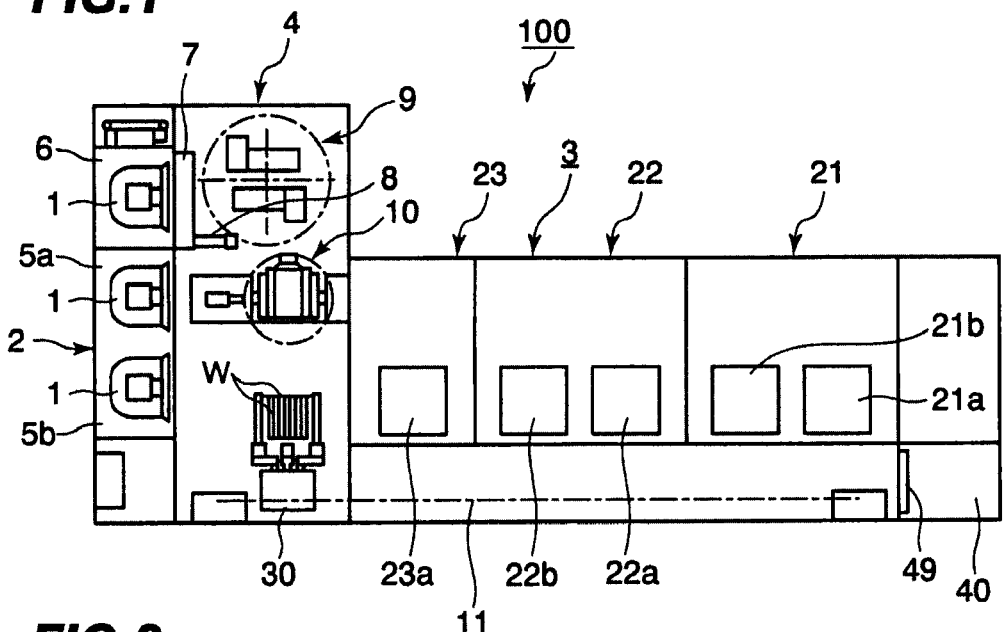
FIG. 1 is a schematic plan view illustrating a substrate processing system equipped with a cleaning apparatus of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

One of the goals of the present disclosure is to provide a cleaning apparatus that cleans a holding member including a holding unit having a plurality of holding grooves to hold a substrate, and a rear-end unit extended from the holding unit with no holding grooves thereon, a substrate processing system equipped with the cleaning apparatus, a cleaning method based on the cleaning apparatus, a program to perform the cleaning method and a storage medium to store the program. With the cleaning apparatus of the present disclosure, the adhesion of the cleaning liquid to the rear-end unit, one of portions where a drying process is difficult in the holding member, can be prevented, while the holding unit is cleaned by spraying the cleaning liquid to the holding unit of the holding member that holds the substrate.

According to an embodiment, the cleaning apparatus of the present disclosure cleans a holding member having a holding unit, and a rear-end unit. In particular, the cleaning apparatus comprises a cleaning unit that cleans the holding unit by spraying a cleaning liquid to the holding unit of the holding member, and a cover unit that covers the rear-end unit by performing a back-and-forth movement with respect to the holding member. It is noted that the holding unit is formed with a plurality of holding grooves to hold a substrate and the rear-end unit is extended from the holding unit with no holding grooves thereon.

Specifically, the cover unit is configured to make a back-and-forth movement from a lower side toward the holding member, and cover the rear-end unit of the holding member when the cover unit approaches the holding member.

The holding member is formed with a stick-shaped object, and the cover unit has a concave section suitable for the stick-shaped holding member.

A seal member may be attached in between the holding unit and the rear-end unit to perform a sealing operation between the seal member and the cover unit when the cover unit approaches the holding member to cover the rear-end unit.

Each of the seal member and the cover unit may be configured in such a way that the seal member and the cover unit are contacted by moving the holding member toward the rear-end unit, after the cover unit approaches the holding member to cover the rear-end unit, so that a sealing operation is performed when the seal member and the cover unit are contacted.

The cover unit of the cleaning apparatus of the present disclosure includes an elevated member and a cover member attached to the elevated member. The elevated member may be configured to make a back-and-forth movement between a first position where the cover unit covers the rear-end-unit and a second position where the cover unit retreats from the rear-end unit.

An operation mechanism may be installed to the rear-end unit side of the holding member to operate the holding member.

The substrate processing system of the present disclosure processes the substrate and equipped with the cleaning apparatus as described above.

A cleaning method according to an embodiment of the present disclosure is directed to clean a holding member including a holding unit, and a rear-end unit. The cleaning method comprises covering the rear-end unit by introducing a cover unit to the holding member, and cleaning the holding unit by spraying a cleaning liquid to the holding unit while the rear-end unit is covered by the cover unit. It is noted that the the holding unit is formed with a plurality of holding grooves to hold a substrate, the rear-end unit is extended from the holding unit with no holding grooves thereon, and the cover unit is configured to make a back-and-forth operation with respect to the holding member.

According to the cleaning method of the present disclosure, the cover unit may be retreated from the holding member after the cleaning process that cleans the holding unit by spraying the cleaning liquid to the holding unit of the holding member.

According to the cleaning method of the present disclosure, the cover unit may perform a back-and-forth operation from a lower side toward the holding member, and cover the rear-end unit of the holding member when the cover unit approaches the holding member.

According to the cleaning method of the present disclosure, a seal member may be installed between the holding unit and the rear-end unit of the holding member, and configured to achieve a sealing between the seal member and the cover unit when the cover unit approaches the holding member to cover the rear-end unit of the holding member.

At this time, each of the seal member and the cover unit may be configured in such a way that the seal member and the cover unit are contacted by moving the holding member toward the rear-end unit, after the cover unit approaches the holding member to cover the rear-end unit so that a sealing operation is performed when the seal member and the cover unit are contacted.

According to the cleaning method of the present disclosure, an operation mechanism may be installed to the rear-end unit side of the holding member to operate the holding member.

A program of the present disclosure may be executed by a control computer of a cleaning apparatus to execute a cleaning method that cleans a holding member having a holding unit and a rear-end unit. The method comprises covering the rear-end unit by introducing a cover unit to the holding member, and cleaning the holding unit by spraying a cleaning liquid to the holding unit while the rear-end unit is covered by the cover unit. It is noted that the holding unit is formed with a plurality of holding grooves to hold a substrate, the rear-end unit is extended from the holding unit with no holding grooves thereon, and the cover unit is configured to make a back-and-forth operation with respect to the holding member.

A storage medium of the present disclosure stores a program executable by a control computer of a cleaning apparatus to execute a cleaning method that cleans a holding member having a holding unit and a rear-end unit. The method comprises covering the rear-end unit by introducing a cover unit to the holding member, and cleaning the holding unit by spraying a cleaning liquid to the holding unit while the rear-end unit is covered by the cover unit. It is noted that the holding unit is formed with a plurality of holding grooves to hold a substrate, the rear-end unit is extended from the holding unit with no holding grooves thereon, and the cover unit is configured to make a back-and-forth operation with respect to the holding member.

Figure 2:
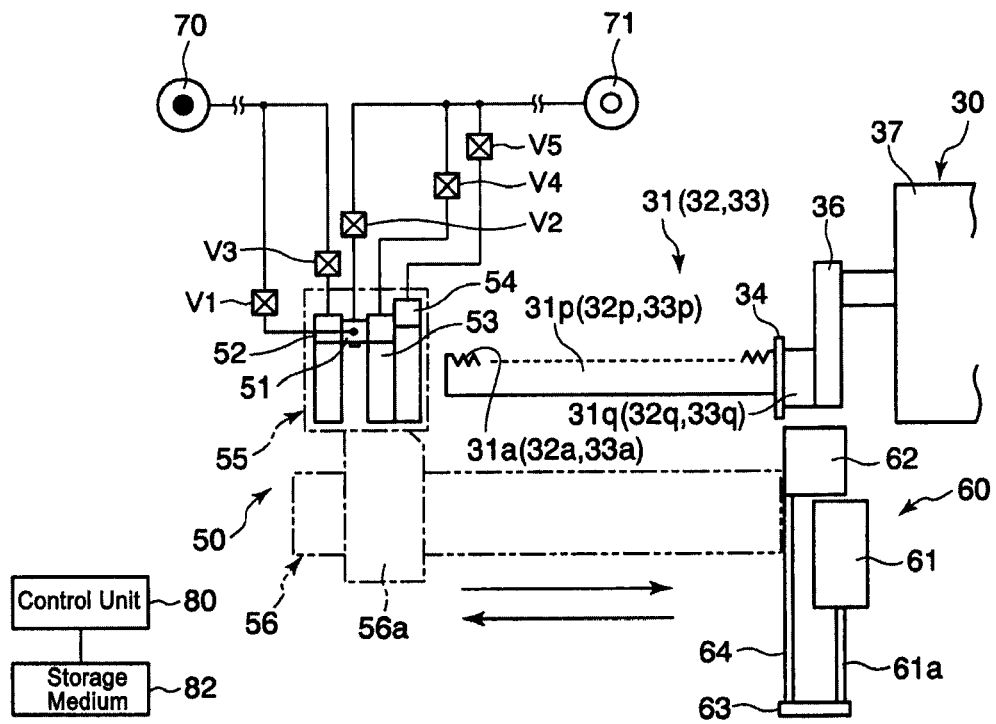
FIG. 2 is a schematic diagram of the cleaning apparatus of the present disclosure illustrating a state when the cover unit does not cover the rear-end unit of the holding member.
Figure 4:
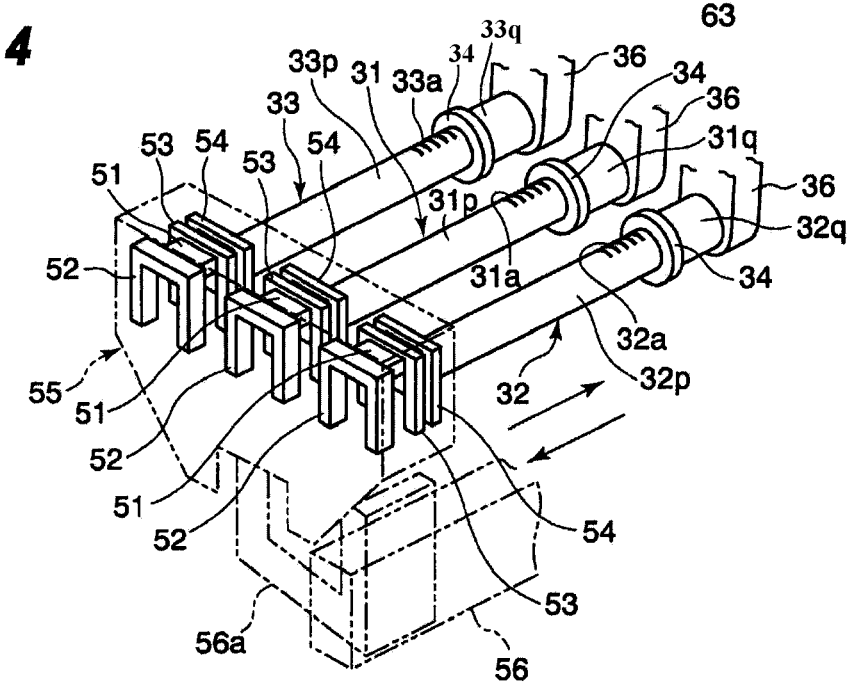
FIG. 4 illustrates the constitution of the cleaning unit of the cleaning apparatus as shown in FIG. 2.
Figure 5:
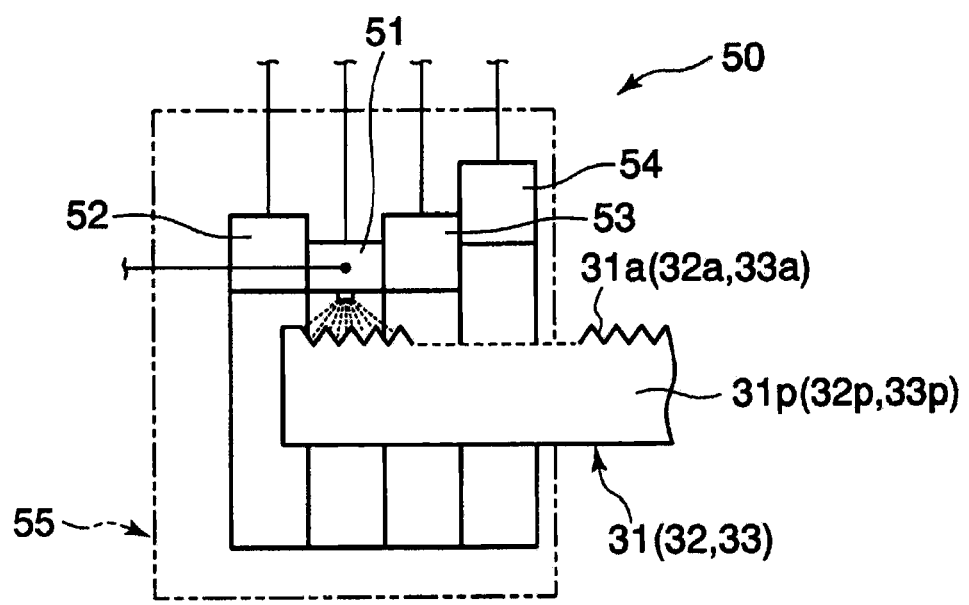
FIG. 5 is a side view of the cleaning unit as shown in FIG. 4, illustrating the constitution of the cleaning unit.
Figure 6:
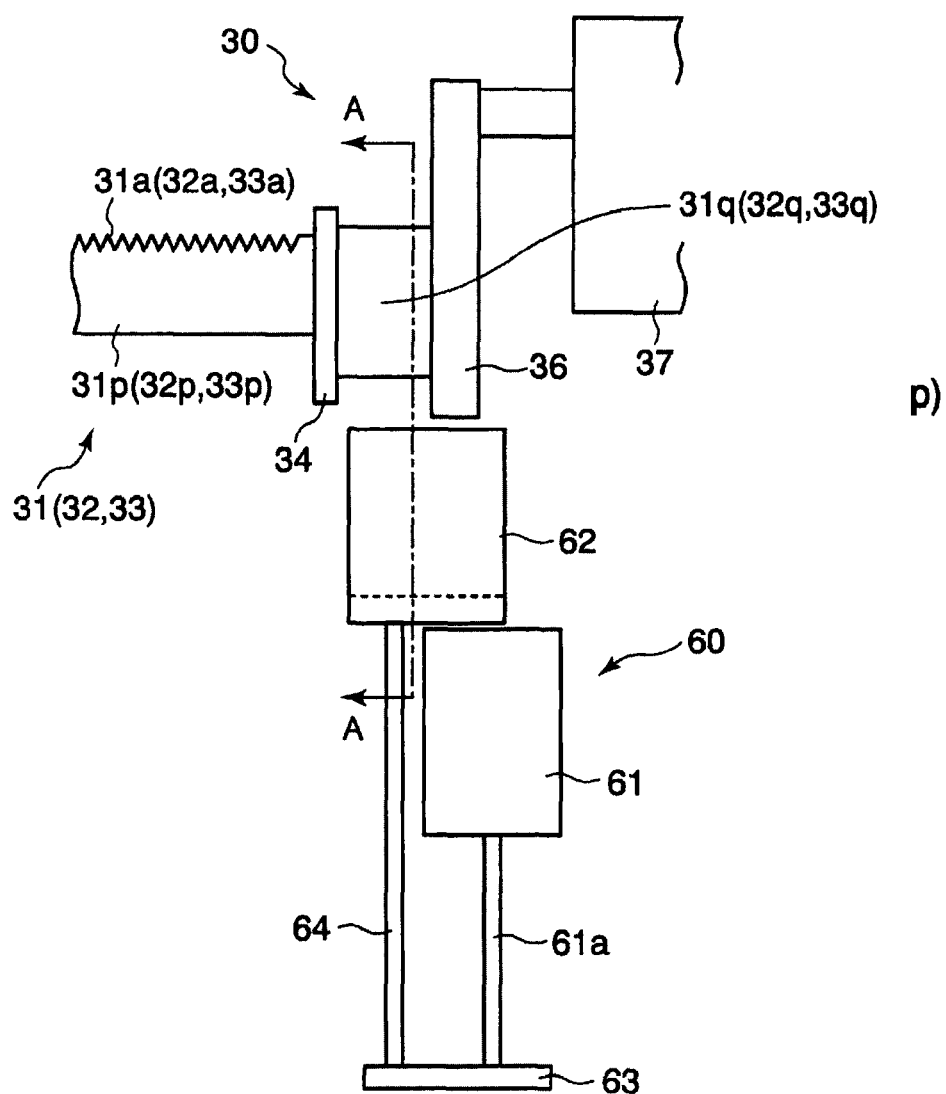
FIG. 6 is an exploded view of the cover unit of the cleaning apparatus as shown in FIG. 2, illustrating a state when the cover unit does not cover the rear-end unit of the holding member.
Figure 10:
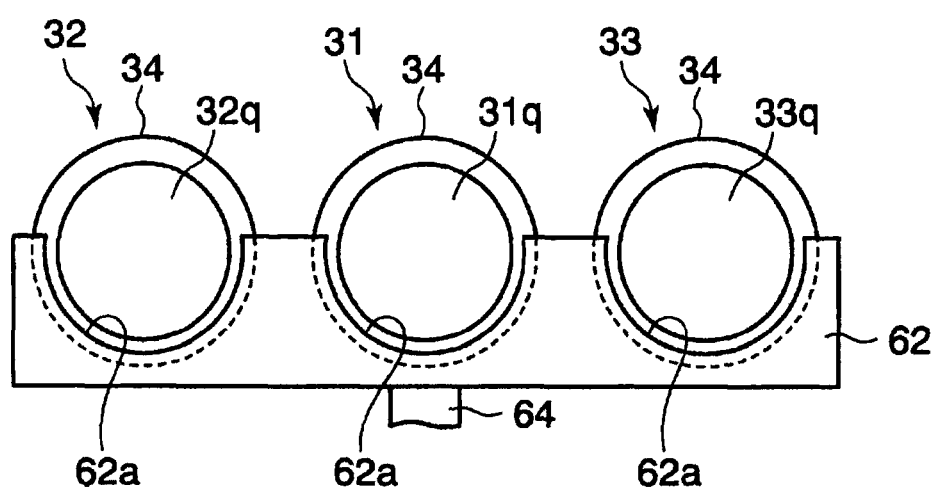
FIG. 10 is a cross-sectional view of the cover unit of the cleaning apparatus and holding member viewed from the B-B direction of FIG. 7, illustrating a state when the cover unit covers the rear-end unit of the holding member.

Hereinafter, an exemplary embodiment as a non-limiting example of the present disclosure will be described with reference to appended drawings. In all of the appended drawings, the same or corresponding members (or components) are designated with the same or corresponding reference numerals to omit repeated descriptions. Each of FIG. 1 or 2 illustrates the cleaning apparatus and the substrate processing system equipped with the cleaning apparatus according to an exemplary embodiment of the present disclosure. In particular, FIG. 1 is a schematic plan view of the substrate processing system equipped with the cleaning apparatus of the present disclosure, and FIGS. 2 and 3 each illustrates a schematic diagram of the cleaning apparatus. FIGS. 4 and 5 each illustrates the constitution of the cleaning unit of the cleaning apparatus as shown in FIG. 2, and each of FIG. 6 or 10 illustrates the constitution of the cover unit of the cleaning apparatus as shown in FIG. 2.

Referring to FIG. 1, a substrate processing system 100 equipped with the cleaning apparatus of the present disclosure will be described. Substrate processing system 100 performs a batch-type cleaning process for a plurality of substrates such as semiconductor wafers (hereinafter wafers W). For example, twenty-five wafers may be cleaned simultaneously in a batch.

Substrate processing system 100 includes a delivery unit 2 to deliver a carrier 1 that receives a wafer W on a horizontal direction, a processing unit 3 that performs a drying process of the substrate after processing the substrate with a chemical liquid or a cleaning liquid, and a transfer unit 4, disposed between delivery unit 2 and processing unit 3, to transfer the wafer W as well as adjust the position, posture and gaps of the wafer W. Substrate processing system 100 may be installed at a clean room environment where a purified air supplied from the ceiling of the clean room flows downwardly.

Regarding delivery unit 2, a carrier carry-in unit 5a and a carrier carry-out unit 5b are installed in parallel at an end portion of substrate processing system 100, along with a wafer transfer unit 6. A transfer mechanism (not shown) may be installed between carrier carry-in unit 5a and wafer transfer unit 6. Carrier 1 may be transferred from carrier carry-in unit 5a to wafer transfer unit 6 using wafer transfer unit 6.

Moreover, processing unit 3 includes a first processing unit 21, a second processing unit 22 and a third processing unit 23 sequentially disposed from the most remote side of transfer unit 4. First processing unit 21 includes a first chemical liquid processing part 21a that removes particles or organic contaminants adhered on the wafer W, and a first water processing part 21b that overflows the cleaning water such as deionized water. Second processing unit 22 includes a second chemical liquid processing part 22a that removes metallic contaminants adhered on the wafer W, and a second water processing part 22b that overflows the cleaning water such as deionized water. Also, third processing unit 23 includes cleaning/drying processing unit 23a that removes an oxidized film adhered on the wafer W.

Processing unit 3 is provided with a cleaning apparatus 40 that cleans or dries a chuck 30 at the most remote side from transfer unit 4, such as an outer side of first processing unit 21. A detailed description will follow for chuck 30 and cleaning apparatus 40. The position of cleaning apparatus 40 may not be limited to the most remote side from transfer unit 4 in processing unit 3, and may be provided at other places such as in between second processing unit 22 and third processing unit 23, or in between third processing unit 23 and transfer unit 4.

Carrier 1 has a cover unit that opens/closes the main body of the barrel and an opening of the main body of the barrel. The main body of the barrel has an opening (not shown) at a side, and holding grooves (not shown) in its internal wall that holds a plurality of wafers W such as 25 wafers with a horizontal direction along a vertical direction with a predetermined gap. Also, a cover open/close mechanism 7, which will be described later, may be provided to open/close the cover of carrier 1.

Wafer transfer unit 6 is open to transfer unit 4, and the opening is provided with cover open/close mechanism 7. The cover of carrier 1 is configured to be opened or closed by cover open/close mechanism 7. Accordingly, the cover of carrier 1 that receives the pre-processed wafers W transferred to wafer transfer unit 6 may be removed by cover open/close mechanism 7 thereby allowing the wafers W within carrier 1 to be carried out, and the cover may be closed again by cover open/close mechanism 7 after all of the wafers W are carried out. Moreover, the cover of an empty carrier 1 transferred to wafer transfer unit 6 may be removed by open/close mechanism 7 thereby allowing the wafers W to be carried into carrier 1, and the cover may be closed again by cover open/close mechanism 7 after all of the wafers W are carried in. Also, a mapping sensor 8 may be installed near the opening of wafer transfer unit 6 to count the number of stored wafers W inside carrier 1.

A wafer transfer arm 9 is installed in transfer unit 4 configured to maintain a plurality of wafers (25 wafers for example) on a horizontal direction, and transfer the wafers W on a horizontal direction between carrier 1 of wafer transfer unit 6. Also, transfer unit 4 may include a gap adjusting mechanism (not shown) such as a pitch-changer that maintains a plurality of wafers (25 wafers for example) in a vertical direction with a predetermined gap. Furthermore, a posture change mechanism 10 may be installed in between wafer transfer arm 9 and the gap adjusting mechanism to convert a plurality of wafers W (25 wafers for example) from a horizontal direction to a vertical direction, or vice versa. Additionally, a position detecting mechanism (not shown) such as a notch-aligner may be installed near posture change mechanism 10 to detect the notch (not shown) installed on the wafers W converted into a vertical direction by posture change mechanism 10.

Also, a transfer path 11 is installed in transfer unit 4 that connects transfer unit 4 to processing unit 3, and a chuck 30 is installed on transfer path 11 to maintain and move the wafers W along transfer path 11. Chuck 30 is configured to transfer the wafer W to either one of first chemical liquid processing part 21a and first water processing part 21b of first processing unit 21, second chemical liquid processing part 22a and second water processing part 22b of second processing unit 22, and cleaning/drying processing unit 23a of third processing unit.

Referring to FIG. 4, chuck 30 includes a stick-shaped holding member 31 that supports the lower part of wafer W, and a pair of stick-shaped holding member 32, 33 that holds the edge of the wafer W on both side of holding member 31. Each of holding members 31, 32, 33 includes respective holding units 31p, 32p, 33p each formed with a plurality of holding grooves 31a, 32a, 33a to hold a plurality of wafers W (50 wafers, for example), and rear-end units 31q, 32q, 33q extended from the respective holding units 31p, 32p, 33p with no holding grooves thereon. An operation mechanism 37 may be installed at a side of each rear-end units 31q, 32q, 33q of respective holding members 31, 32, 33 to operate each of holding members 31, 32, 33. Operation mechanism 37 may be configured to operate each of holding members 31, 32, 33 independently.

A disk-shaped anti-scattering plate 34 may be installed in between each of holding units 31p, 32p, 33p and each of corresponding rear-end units 31q, 32q, 33q crossing each of holding members 31, 32, 33 orthogonally. As a result, the scattering and attaching of the cleaning liquid (such as deionized water used for cleaning holding members 31, 32, 33) to rear-end units 31q, 32q, 33q may be prohibited by the anti-scattering plate. Holding members 32, 33 on each side of holding member 31 are positioned along with the same horizontal direction as holding member 31 when there is no wafer W to be held. However, when there is wafer W to be held, holding members 32, 33 on each side of holding member 31 may be configured to be displaced while drawing a circular arc on a top side, thereby holding the lower portions of the wafer W on both sides. Moreover, each of holding members 31, 32, 33 is made of a corrosion/chemical-resistant resin material such as polyetereterketon (PEEK) or polychlrorotrifluorethylene (PCCTFE). Also, anti-scattering plate 34 is made of a highly corrosion/chemical-resistance resin material such as the same material used for holding members 31, 32, 33.

As illustrated in FIG. 2 or 4, a connection member 36 is installed in each of rear-end units 31$q$, 32$q$, 33$q$ of corresponding holding members 31, 32, 33, each configured to connect operation mechanism 37 to holding members 31, 32, 33.

As described above, chuck 30 receives a predetermined number of wafers W (50 wafers, for example) corresponding to a single lot from the gap adjusting mechanism of transfer unit 4, and transfers the wafers W to processing unit 3. Subsequently, chuck 30 transfers the predetermined number of wafers W corresponding to the single lot to the gap adjusting mechanism, after the wafers W go through an appropriate process at processing unit 3.

A detailed description of cleaning apparatus 40 follows hereinafter. As described above, cleaning apparatus 40 is configured to clean or dry each holding members 31, 32, 33 of chuck 30.

Referring back to FIG. 1, each of transfer path 11 and cleaning apparatus 40 is partitioned by a wall unit provided with an opening that introduces each holding members 31, 32, 33 of chuck 30 into the inner side of cleaning apparatus 40. Also, the opening is provided with a shutter mechanism 49 configured to make a back-and-forth operation between a close position that closes/closes the opening of the wall unit positioned between transfer path 11 and cleaning apparatus 40, and an open position that opens the opening of the wall unit. Specifically, shutter mechanism 49 is configured to move and retreat from the close position that closes the opening of the wall unit to an upper side thereby opening the opening of the wall unit. Each of holding members 31, 32, 33 of chuck 30 is introduced into cleaning apparatus 40 while shutter mechanism 49 opens the opening of the wall unit. Subsequently, the cleaning apparatus 40 performs a cleaning process for holding members 31, 32, 33 while shutter mechanism 49 closes the opening of the wall unit.

Cleaning apparatus 40 includes a cleaning unit 50 that cleans holding members 31, 32, 33 by spraying a cleaning liquid to holding units 31$p$, 32$p$, 33$p$ of corresponding holding members 31, 32, 33 of chuck 30, and a cover unit 60 that covers a portion of each of rear-end units 31$q$, 32$q$, 33$q$ of corresponding holding members 31, 32, 33 while each of holding units 31$p$, 32$p$, 33$p$ is cleaned by cleaning unit 50.

The constitution of cleaning unit 50 is described hereinafter by referring to FIG. 2 or 5. Cleaning unit 50 includes a two-fluid supply nozzle 51, a cleaning liquid supply nozzle 52, a first dry gas supply nozzle 53, and a second dry gas supply nozzle 54. Two-fluid supply nozzle 51 is configured to spray the cleaning liquid such as deionized water and N2 gas (nitrogen gas) toward holding grooves 31$a$, 32$a$, 33$a$ of corresponding holding units 31$p$, 32$p$, 33$p$ of corresponding holding members 31, 32, 33 (holding member 31 hereinafter). Also, cleaning liquid supply nozzle 52 sprays the cleaning liquid such as denionized water to the side portion of holding unit 31$p$ of holding member 31. Furthermore, first dry gas supply nozzle 53 sprays a gas such as N2 gas toward the side of holding unit 31$a$ of holding member 31. In particular, second dry gas supply nozzle 54 is configured to spray a gas such as N2 gas toward holding grooves 31$a$ of holding unit 31$p$ of holding member 31, the lower portion of the side face and anti-scattering plate 34. Instead of N2 gas, a purified air may be used by nozzles 51, 53, 54.

With these features, two-fluid supply nozzle 51 may be connected to a cleaning liquid supply 70 and a gas supply 71 via a first open/close valve (V1) and a second open/close valve (V2), respectively. Moreover, regarding two-fluid supply nozzle 51, the cleaning liquid such as deionized water is provided from cleaning liquid supply 70 and a gas such as N2 gas is provided from gas supply 71. The provided cleaning liquid and N2 gas are combined within two-fluid supply nozzle 51 generating droplets (mist) of the cleaning liquid. Two-fluid supply nozzle 51 then sprays the generated droplets of the cleaning liquid toward holding grooves 31$a$ of holding unit 31$p$ of holding member 31.

Cleaning liquid supply nozzle 52 is connected to cleaning liquid supply 70 via the third open/close valve (V3), and the cleaning liquid such as deionized water is provided from cleaning liquid supply 70 to cleaning liquid supply nozzle 52 which sprays the cleaning liquid to both sides of holding member 31.

First dry gas supply nozzle 53 is connected to gas supply 71 via fourth open/close valve (V4), and the gas such as N2 gas is provided from gas supply 71 to first dry gas supply nozzle 53 which sprays the gas to both sides of holding grooves 31$a$ of holding unit 31$p$ of holding member 31.

Second dry gas supply nozzle 54 is connected to gas supply 71 via fifth open/close valve (V5), and the gas such as N2 gas is provided from gas supply 71 to second dry gas supply nozzle 54 which sprays the gas to holding grooves 31$a$ of holding unit 31$p$ of holding member 31, both sides of the lower portion of the holding member, and anti-scattering plate 34. Second dry gas supply nozzle 54 is configured to spray with a lower pressure than the spray pressure from first dray gas supply nozzle 53, and perform a finishing dry process by not re-adhering the cleaning liquid to holding grooves 31$a$ of holding unit 31$p$ and both sides of the holding grooves that were dried primarily by first dry gas supply nozzle 53.

Two-fluid supply nozzle 51, cleaning liquid supply nozzle 52, first dry gas supply nozzle 53 and second dry gas supply nozzle 54 are installed inside a nozzle box 55. A cover unit configured to be open at the lower portion is extended from the lower portion of nozzle box 55, and by this cover unit, the scattering of the cleaning liquid toward the neighborhood is suppressed.

Nozzle box 55 is connected to an operating unit 56$a$ of an air cylinder 56, and operating unit 56$a$ is configured to make a back-and-forth movement on a horizontal direction along with the longitudinal direction of holding member 31. Moreover, cleaning liquid supply nozzle 52, two-fluid supply nozzle 51, first dry gas supply nozzle 53, and second dry gas supply nozzle 54 are sequentially aligned from the front-end to the rear-end of holding member (from the left side to the right side in FIG. 2). At this instance, while nozzle box 55 is being moved from the front-end to the rear-end of holding member 31 (to the right side in FIG. 2 or FIG. 3), a gas and cleaning liquid are sprayed from two-liquid supply nozzle 51 toward holding grooves 31$a$ of holding unit 31$p$ to clean holding grooves 31$a$ first. Subsequently, the cleaning liquid is sprayed from cleaning liquid supply nozzle 52 to both sides of holding unit 31$p$ of holding member 31 to thereby clean holding member 31. Moreover, when nozzle box 55 is moved from the front-end to the rear-end of holding member 31 (to the left side in FIG. 2 or FIG. 3), a cleaning process is performed for holding member 31 by spraying the gas from two-liquid supply nozzle 51 toward holding grooves 31$a$ of holding unit 31$p$ of holding member 31, from first gas supply nozzle 53 toward holding grooves 31$a$ of holding unit 31$p$ of holding member 31 and both sides of the holding grooves, and from second dry gas supply nozzle 54 toward holding grooves 31a of holding unit 31p of holding member 31, the lower portions of the both sides of the holding grooves, and anti-scattering plate 34.

The constitution of cover unit 60 will be described hereinafter by referring to FIGS. 2, 3, 6 and 10. Cover unit 60 covers a portion of chuck 30 while chuck 30 is being cleaned by cleaning unit 50. Specifically, cover unit 60 covers rear-end units 31q, 32q, 33q of corresponding holding members 31, 32, 33 of chuck 30.

The following will describe each components of cover unit 60 in more detail. Cover unit 60 includes a cover member 62 that selectively covers rear-ends 31q, 32q, 33q of each of holding members 31, 32, 33, and a cylinder 61 that makes cover member 62 to have a back-and-forth movement on a vertical direction. A first connection member 63 extendable along the horizontal direction is installed on the front-end of cylinder 61, a second connection member 64 extendable along the vertical direction is installed on the lower-end portion of cover member 62, and second connection member 64 is attached to first connection member 63. Specifically, cylinder 61 includes an extendable shaft 61a extendable from the main body of cylinder 61 to the lower part, and first connection member 63 is attached to the front-end (a lower end) of extendable shaft 61a. Moreover, second connection member 64 is attached to first connection member 63 so that second connection member 64 can be extendable from first connection member 63.

Figure 7:
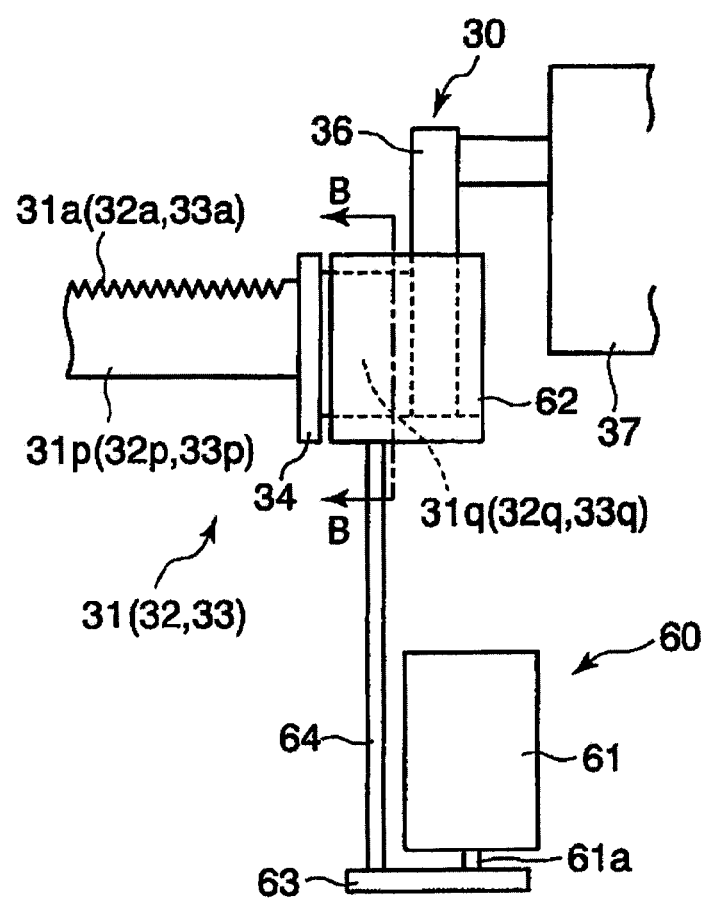
FIG. 7 illustrates a state when the cover unit of the cover member is elevated from the state illustrated in FIG. 6.
Figure 9:
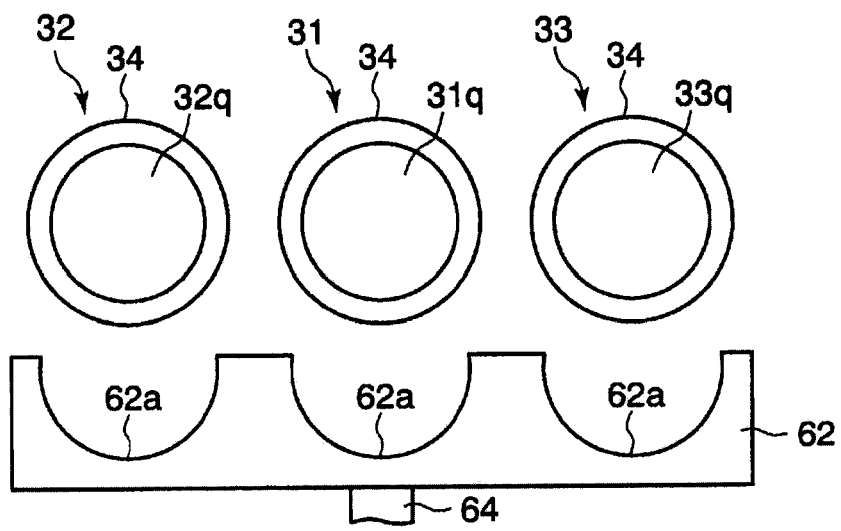
FIG. 9 is a cross-sectional view of the cover unit of the cleaning apparatus and the holding member viewed from the A-A direction of FIG. 6, illustrating a state when the cover unit does not cover the rear-end unit of the holding member.

When cylinder 61 extends extendable shaft 61a to the lower side, cover member 62 is separated from each of holding members 31, 32, 33 to the lower side, and cover member 62 may not cover rear-end units 31q, 32q, 33q of each of holding members 31, 32, 33, as illustrated in FIGS. 6 and 9. In the mean time, when cylinder 61 retreats extendable shaft 61a to the upper side, cover member 62 approaches each of holding members 31, 32, 33, to cover rear-end units 31q, 32q, 33q of each of holding members 31, 32, 33 as well as connection member 36, as illustrated in FIGS. 7 and 10. In particular, cylinder 61 may be installed inside a cover having a double-structure.

A concave unit 62a is formed on the top portion of cover member 62 suitable for rear-end units 31q, 32q, 33q of each holding members 31, 32, 33, as illustrated in FIGS. 9 and 10. The cross-section of concave unit 62a is substantially a half-circle shape, and the radius of concave unit 62a at the cross-section is slightly larger than rear-end units 31q, 32q, 33q of each holding members 31, 32, 33. When cylinder 61 retreats extendable shaft 61a to the upper side, each of rear-end units 31q, 32q, 33q of each of corresponding holding members 31, 32, 33 is inserted into respective concave unit 62a as illustrated in FIG. 10, and the lower half of rear-end units 31q, 32q, 33q is covered by cover member 62.

Cover member 62 is made of a highly corrosion/chemical-resistive resin material, such as, for example, the same resin material as used in holding members 31, 32, 33 of chuck 30.

As illustrated in FIGS. 7 and 10, when rear-end units 31q, 32q, 33q of each holding members 31, 32, 33 are covered by cover member 62 while two-fluid supply nozzle 51 or cleaning liquid supply nozzle 52 of cleaning unit 50 sprays the cleaning liquid to each of holding grooves 31a, 32a, 33a of corresponding holding members 31, 32, 33, the adhesion of droplets of the cleaning liquid to the lower portion of rear-end units 31q, 32q, 33q of each holding members 31, 32, 33 is prohibited. There are chances that the droplets of the cleaning liquid may be adhered to the upper portion of rear-end units 31q, 32q, 33q of each corresponding holding members 31, 32, 33. However, the cleaning liquid droplets adhered to the upper portion of rear-end units 31q, 32q, 33q may be eliminated by the gas sprayed from first dry gas supply nozzle 53 or second dry gas supply nozzle 54 to each holding members 31, 32, 33.

As illustrated in FIG. 7, when cylinder 61 retreats extendable shaft 61a to the upper side, and each of rear-end units 31q, 32q, 33q of each corresponding holding members 31, 32, 33 is covered by cover member 62, there could be a gap between circular-shaped anti-scattering plate 34 attached to each of holding members 31, 32, 33 and cover member 62. At this instance, operation mechanism 37 may move each of holding members 31, 32, 33 toward the rear-end side on a horizontal direction (to the right side in FIG. 7) making anti-scattering plate 34 and cover member 62 be contacted. See, for example, FIG. 8. At this time, a sealing is achieved between anti-scattering plate 34 and cover member 62. When a sealing is achieved between anti-scattering plate 34 and cover member 62 by contacting anti-scattering plate 34 to cover member 62, the introduction of the cleaning liquid droplets from the half-circular shaped opening of the side portion of cover member 62 into concave unit 62a of cover member 62 may be prohibited, when the cleaning liquid is sprayed from two-liquid supply nozzle 51 or cleaning liquid supply nozzle 52 of cleaning unit 50 to holding grooves 31a, 32a, 33a of each of holding members 31, 32, 33.

Referring to FIG. 2, cleaning apparatus 40 may be provided with a control unit 80 built with a control computer that controls each components of cleaning apparatus 40. Control unit 80 is connected to each of the components of cleaning apparatus 40 to control the cleaning processes of wafers W at cleaning apparatus 40. The control substance of each component of cleaning apparatus 40 by control unit 80 will be described later. Control unit 80 of the present disclosure is accessed by a storage medium 82 that stores a control program configured to realize the cleaning process at cleaning apparatus 40 with a control by control unit 80. Storage medium 82 includes a disk-type storage medium such as ROM, RAM, hard disk, CD-ROM, DVD-ROM, and other types of publicly known storage medium. Also, the desired cleaning process is performed by calling for the control program from storage medium 82 and executing the control program at control unit 80.

The operation of cleaning apparatus 40 having components as described above will be described hereinafter. Specifically, an operation where cleaning apparatus 40 performs a cleaning process for each of holding members 31, 32, 33 of chuck 30 will be described. Also, the operations as appeared below will be conducted by the control operation of control unit 80 over each of the components of cleaning apparatus 40.

In performing a cleaning operation of each of holding members 31, 32, 33, chuck 30, first of all, moves to a position closest to cleaning apparatus 40 on transfer path 11, which corresponds to the right-end position of transfer path 11 in FIG. 1. At this time, shutter mechanism 49 opens the opening of the wall unit positioned between transfer path 11 and cleaning apparatus 40. Also, cylinder 61 of cover unit 60 is in a state where extendable shaft 61a is extended, as illustrated in FIG. 6. Subsequently, after each of holding members 31, 32, 33 of chuck 30 is introduced into cleaning apparatus 40, shutter mechanism 49 is moved from an opening position to a close position. Specifically, shutter mechanism 49 is lowered to close the opening of the wall unit by shutter mechanism 49. Moreover, after each of holding members 31, 32, 33 of chuck 30 is introduced into cleaning apparatus 40, cylinder 61 of cover unit 60, as illustrated in FIG. 7, retreats extendable shaft 61a to an upper side moving cover member 62 of cover unit 60 to an upper side. As a result, cover member 62 covers the lower half of each of rear-end units 31q, 32q, 33q of corresponding holding members 31, 32, 33. At this time, as illustrated in FIG. 7, a gap may be formed between anti-scattering plate 34 of each of holding members 31, 32, 33 and cover member 62.

Subsequently, operation mechanism 37 of chuck 30 moves each of holding members 31, 32, 33 toward the rear-end side along a longitudinal direction. Namely, operation mechanism 37 moves each of holding members 31, 32, 33 to the right direction of FIG. 7. With these operations, anti-scattering plate 34 of each of holding members 31, 32, 33 and cover member 62 are contacted, achieving a sealing between anti-scattering plate 34 and cover member 62.

Figure 3:
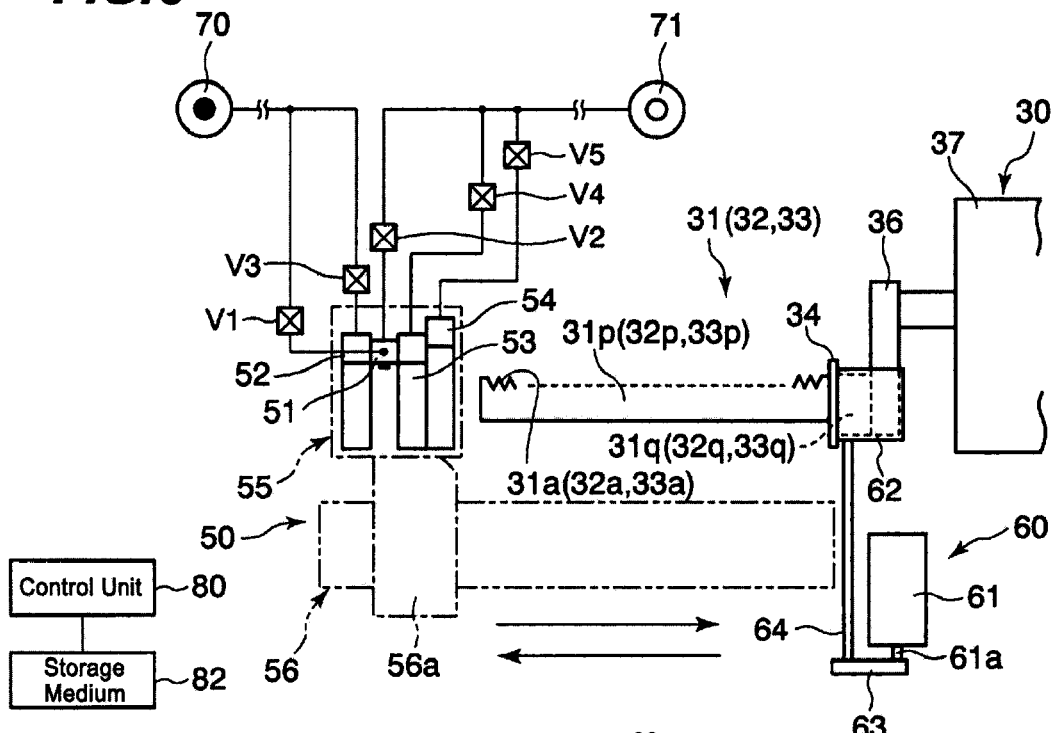
FIG. 3 is a schematic diagram of the cleaning apparatus of the present disclosure illustrating a state when the cover unit covers the rear-end unit of the holding member.

Next, operating unit 56a of air cylinder 56 is moved from the front-end portion of each of holding members 31, 32, 33 to the rear-end portion, which is the right-end position in FIG. 3. With these features, nozzle box 55 moves from the front-end to the rear-end of each of holding members 31, 32, 33 (to the right side in FIG. 3). While nozzle box 55 is moving, two-fluid supply nozzle 51 sprays the gas along with the cleaning liquid to each of holding grooves 31a, 32a, 33a of each of corresponding holding members 31, 32, 33 to clean holding grooves 31a, 32a, 33a, and cleaning liquid supply nozzle 52 sprays the cleaning liquid to both sides of holding units 31p, 32p, 33p of each of holding members 31, 32, 33. By doing these, each of holding units 31p, 32p, 33p of corresponding holding members 31, 32, 33 is cleaned.

When nozzle box 55 moves to the rear-end side of holding members 31, 32, 33, operation unit 56a of air cylinder 56 is moved from the rear-end side to the front-end (from the right side to the left side in FIG. 3) of each of holding members 31, 32, 33, as shown in FIG. 3. As a result, nozzle box 55 moves from the rear-end side to the front-end of holding members 31, 32, 33 (to the left side in FIG. 3). While nozzle box 55 is moved as described above, the gas is sprayed from two-fluid supply nozzle 51 to each holding grooves 31a, 32a, 33a of each of corresponding holding members 31, 32, 33. Also, the gas is sprayed from first dry gas supply nozzle 53 to each of holding grooves 31a, 32a, 33a as well as both sides of holding grooves 31a, 32a, 33a. Also, an additional gas is sprayed from second dry gas supply nozzle 54 to each of holding grooves 31a, 32a, 33a, the lower portion of both sides of holding grooves 31a, 32a, 33a, and anti-scattering plate 34. Each of holding members 31, 32, 33 is dried by following these operations.

Subsequently, operation mechanism 37 of chuck 30 moves each of holding members 31, 32, 33 to the front-end side along the longitudinal direction. Namely, operation mechanism 37 moves each of holding members 31, 32, 33 to the left side of FIG. 8 to the point as indicated in FIG. 7. As a result, anti-scattering plate 34 of holding members 31, 32, 33 is separated from cover member 62 making a gap between anti-scattering plate 34 and cover member 62.

Moreover, cylinder 61 of cover unit 60 extends extendable shaft 61a to the lower side as illustrated in FIG. 6, and, as a result, cover member 62 of cover unit 60 is moved to the lower side, thereby separating cover member 62 from each of holding members 31, 32, 33 downwardly. Additionally, shutter mechanism 49 moves from a close position that closes the opening of the wall unit to the opening position, and as a result, the opening, positioned at the wall unit between transfer path 11 and cleaning apparatus 40, is opened. Subsequently, each of holding members 31, 32, 33 of chuck 30 is retreated from cleaning apparatus 40, completing the cleaning of each of holding members 31, 32, 33 of chuck 30.

As described above, cleaning apparatus 40 according to the present disclosure includes cleaning unit 50 that performs a cleaning operation to holding units 31p, 32p, 33p by spraying the cleaning liquid to each of holding units 31p, 32p, 33p of each of corresponding holding members 31, 32, 33 of chuck 30, and cover unit 60 that covers rear-end units 31q, 32q, 33q of each of corresponding holding members 31, 32, 33 by making a back-and-forth movement for holding members 31, 32, 33. Moreover, according to the cleaning method based on cleaning apparatus 40 as described above, cover member 60, configured to make a back-and-forth movement with respect to each of holding members 31, 32, 33, is introduced to each of holding members 31, 32, 33, to cover each of rear-end units 31q, 32q, 33q of each of corresponding holding members 31, 32, 33. The cleaning liquid is sprayed to each of holding units 31p, 32p, 33p of each of corresponding holding members 31, 32, 33 while each of rear-end units 31q, 32q, 33q of each of corresponding holding members 31, 32, 33 is covered by cover unit 60, thereby performing the cleaning of these holding units 31p, 32p, 33p. With these features, the adhesion of cleaning liquid droplets may be prohibited in specific areas where a dry process is difficult such as rear-end units 31q, 32q, 33q of holding members 31, 32, 33, while holding units 31p, 32p, 33p of holding members 31, 32, 33 are cleaned by cleaning unit 50.

Furthermore, cover member 62 of cover unit 60 of cleaning apparatus 40 of the present disclosure is configured to move along with a back-and-forth direction from the lower side to each of holding members 31, 32, 33 of chuck 30, and cover each of rear-end units 31q, 32q, 33q of each of corresponding holding members 31, 32, 33, when cover member 62 approaches to each of holding members 31, 32, 33. With these features, the lower portion of each of rear-end units 31q, 32q, 33q of each of corresponding holding members 31, 32, 33 is covered by cover member 62 so that the cleaning liquid droplets are not adhered to the lower portion of each of rear-end units 31q, 32q, 33q of each of corresponding holding members 31, 32, 33. It is noted that a drying process is difficult with first dry gas supply nozzle 53 or second dry gas supply nozzle 54 for the rear-end units 31q, 32q, 33q of each of corresponding holding members 31, 32, 33, and the cleaning liquid droplets may be easily adhered in the lower portion of each of rear-end units 31q, 32q, 33q of each of corresponding holding members 31, 32, 33, if there is no cover member 60 to cover the rear-end units 31q, 32q, 33q of each of corresponding holding members 31, 32, 33. As a result, since the cleaning liquid droplets are not adhered to the lower portion of the rear-end units 31q, 32q, 33q, the dropping of the cleaning liquid droplets from the lower portion of each of rear-end units 31q, 32q, 33q of each of corresponding holding members 31, 32, 33 is prevented, after completing the cleaning process by cleaning apparatus 40.

In particular, according to cleaning apparatus 40 of the present disclosure, each of holding members 31, 32, 33 is formed with a stick-shaped object, and cover member 62 of cover unit 60 includes a concave section 62a suitable for the stick-shaped holding members 31, 32, 33.

Also, according to cleaning apparatus 40 of the present disclosure, anti-scattering plate 34 (seal member) is attached in between holding units 31p, 32p, 33p and rear-end units 31q, 32q, 33q of each of holding members 31, 32, 33, and a sealing is achieved between anti-scattering plate 34 and cover unit 60 when cover unit 60 approaches each of holding members 31, 32, 33 and covers rear-end units 31q, 32q, 33q. With these features, the cleaning liquid droplets can be prevented from entering into concave section 62a of cover member 62 from the side of the cover member 62.

At this instance, when cover member 62 approaches each of holding members 31, 32, 33 and covers rear-end units 31q, 32q, 33q, operation mechanism 37 moves each of holding members 31, 32, 33 toward rear-end units 31q, 32q, 33q and makes anti-scattering plate 34 and cover member 62 to be contacted, thereby achieving a sealing between anti-scattering plate 34 and cover member 62. Also, when cover member 62 of cover unit 60 approaches each of holding member 31, 32, 33 to cover rear-end units 31q, 32q, 33q, instead of moving each of holding members 31, 32, 33, cover member 62 of cover unit 60 may be moved toward anti-scattering plate 34 of each holding member 31, 32, 33, thereby making a contact between anti-scattering plate 34 and cover member 62.

Figure 8:
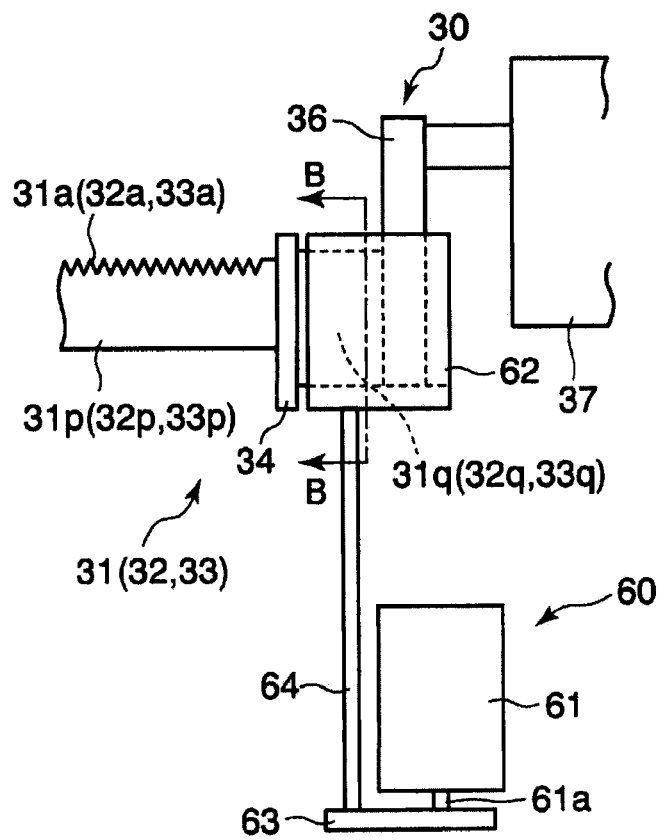
FIG. 8 illustrates a state when the holding member is moved from the state illustrated in FIG. 7 toward the rear-end unit.

The cover unit 60 of cleaning apparatus 40 of the present disclosure includes a cylinder (an elevation member 61) and cover member 62 attached to cylinder 61 via first connection member 62 and second connection member 64. Cylinder 61 makes cover member 62 to have a back-and-forth operation between a cover position (as shown in FIGS. 8 and 10) where cover member 62 covers each of rear-end units 31q, 32q, 33q of each of corresponding holding members 31, 32, 33 and a retreat position (as shown in FIGS. 6 and 9) where cover member 62 retreats from each of rear-end units 31q, 32q, 33q of each of corresponding holding members 31, 32, 33.

Cleaning apparatus 40 of the present disclosure is not limited to embodiments as described above, but may have various alternative embodiments. For example, cleaning unit 50 of cleaning apparatus 40 is not limited to the constitution as shown in FIG. 4 or 5. Cleaning unit 50 may be allowable as long as cleaning unit 50 is equipped with at least a nozzle that can spray the cleaning liquid to each of holding units 31p, 32p, 33p of each of corresponding holding members 31, 32, 33.

Moreover, each of holding members 31, 32, 33 is not limited to a stick-shaped object. Even if each of holding members 31, 32, 33 is other than the stick-shaped object, cover member 62 of cover unit 60 may have an appropriate shape for the stick-shaped holding members 31, 32, 33.

Also, cover unit 60 of cleaning apparatus 40 is not limited to the embodiment as shown in FIG. 6 or 10. For example, the object that performs a back-and-forth operation for cover member 62 between the cover position (as shown in FIGS. 8 and 10) that covers each of rear-end units 31q, 32q, 33q of each of corresponding holding member 31, 32, 33 and the retreat position (as shown in FIGS. 6 and 9) that retreats from each of rear-end units 31q, 32q, 33q of each of corresponding holding member 31, 32, 33, is not limited to cylinder 61, but may be a different operating mechanism.

According to the cleaning apparatus, substrate processing system, cleaning method, program and storage medium of the present disclosure, the adhesion of the cleaning liquid to the rear-end unit is prevented, while the holding unit of the holding member that holds a substrate is cleaned by spraying the cleaning liquid to the rear-end unit, one of portions where a drying process is difficult.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning apparatus that cleans a holding member that holds a plurality of substrates having a holding unit and a rear-end unit, comprising:
    a cleaning unit configured to clean the holding unit by spraying a cleaning liquid to the holding unit of the holding member,
    a cover unit provided separately from the holding unit of the holding member and configured to selectively cover or uncover the rear-end unit by performing a back-and-forth movement with respect to the holding member; and
    a control unit configured to control an overall operation of the cleaning apparatus including the cleaning unit and the cover unit,
    wherein the cover unit includes an elevated member and a cover member attached to the elevated member, and the elevated member is configured to make the back-and-forth movement between a first position where the cover unit covers the rear-end-unit and a second position where the cover unit retreats from the rear-end unit,
    wherein the control unit is configured to output a control signal to the cover unit to cover the rear-end unit when the cleaning liquid is sprayed to the holding unit and uncover the rear-end unit when the cleaning liquid is not sprayed to the holding unit, and
    wherein the holding unit is formed with a plurality of holding grooves each configured to hold a substrate and the rear-end unit is extended from the holding unit with no holding grooves thereon.

2. The cleaning apparatus of claim 1, wherein the cover unit is configured to make a back-and-forth movement from a lower side toward the holding member, and cover the rear-end unit when the cover unit approaches the holding member.

3. The cleaning apparatus of claim 2, wherein the holding member is formed with a linear-type stick-shaped object, and the cover unit has a concave section suitable for the stick-shaped holding member.

4. The cleaning apparatus of claim 1, wherein a seal member is attached in between the holding unit and the rear-end unit of the holding member to achieve a sealing between the seal member and the cover unit, when the cover unit approaches the holding member to cover the rear-end unit.

5. The cleaning apparatus of claim 4, wherein each of the seal member and the cover unit is configured in such a way that the seal member and the cover unit are being contacted by moving the holding member toward the rear-end unit, after the cover unit approaches the holding member to cover the rear-end unit so that a sealing is achieved when the seal member and the cover unit are contacted.

6. The cleaning apparatus of claim 1, wherein an operation mechanism is installed to rear-end unit side of the holding member of the cleaning apparatus to operate the holding member.

7. A substrate processing system that processes a substrate comprises the cleaning apparatus of claim 1.

* * * * *